(12) United States Patent
Matsukaze

(10) Patent No.: US 7,446,472 B2
(45) Date of Patent: Nov. 4, 2008

(54) ORGANIC MULTICOLOR EMISSION AND DISPLAY DEVICE AND METHOD FOR MANUFACTURING SAME

(75) Inventor: Noriyuki Matsukaze, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 657 days.

(21) Appl. No.: 10/520,951

(22) PCT Filed: Jul. 11, 2003

(86) PCT No.: PCT/JP03/08844

§ 371 (c)(1),
(2), (4) Date: Jan. 11, 2005

(87) PCT Pub. No.: WO2004/008811

PCT Pub. Date: Jan. 22, 2004

(65) Prior Publication Data

US 2005/0174048 A1    Aug. 11, 2005

(30) Foreign Application Priority Data

Jul. 15, 2002   (JP)   ............... 2002-206226

(51) Int. Cl.
  *H01J 1/62*   (2006.01)
  *H01J 63/04*   (2006.01)
(52) U.S. Cl. .................. 313/506; 313/112; 313/496; 313/504; 313/512
(58) Field of Classification Search ................. 313/498, 313/501, 504, 506, 512, 112
See application file for complete search history.

(56) References Cited

U.S. PATENT DOCUMENTS 4,839,557 A * 6/1989 Schrank ............... 313/509

5,304,419 A    4/1994 Shores
6,072,450 A    6/2000 Yamada et al.
6,635,988 B1 * 10/2003 Izumizawa et al. .......... 313/504

(Continued)

FOREIGN PATENT DOCUMENTS

JP    57-157487 A    9/1982

(Continued)

OTHER PUBLICATIONS

International Search Report issued in international application No. PCT/JP03/08844 having a mailing date of Sep. 2, 2003. The present application claims priority from this PCT application.

(Continued)

*Primary Examiner*—Karabi Guharay
*Assistant Examiner*—Kevin Quarterman
(74) *Attorney, Agent, or Firm*—Rossi, Kimms & McDowell, LLP

(57) ABSTRACT

A transparent first substrate and a second substrate of an organic multicolor emission and display device are positioned opposite to each other with a predetermined clearance and sealed with a gap material that performs desiccating a surrounding atmosphere. The gap material advantageously has different void fractions between in an inner portion facing a sealed space within the device and in an outer portion facing an external atmosphere.

Featuring the above structure, an organic multicolor emission and display device of color conversion system has been provided that maintains stable light emitting performance for a long period and exhibits excellent visibility angle characteristic.

21 Claims, 4 Drawing Sheets

U.S. PATENT DOCUMENTS

| | | | |
|---|---|---|---|
| 6,833,668 B1 * | 12/2004 | Yamada et al. | 313/505 |
| 6,867,539 B1 * | 3/2005 | McCormick et al. | 313/504 |
| 2003/0230972 A1 * | 12/2003 | Cok | 313/504 |

FOREIGN PATENT DOCUMENTS

| | | | |
|---|---|---|---|
| JP | 58-147989 A | 9/1983 |
| JP | 60-202683 A | 10/1985 |
| JP | 1-315988 A | 12/1989 |
| JP | 2-273496 A | 11/1990 |
| JP | 3-152897 A | 6/1991 |
| JP | 3-194895 A | 8/1991 |
| JP | 3-214593 A | 9/1991 |
| JP | 3-261091 A | 11/1991 |
| JP | 5-041281 A | 2/1993 |
| JP | 5-198921 A | 8/1993 |
| JP | 5-258860 A | 10/1993 |
| JP | 7-169567 A | 7/1995 |
| JP | 8-286033 A | 11/1996 |
| JP | 9-035868 A | 2/1997 |
| JP | 9-208944 A | 8/1997 |
| JP | 10-162958 A | 6/1998 |
| JP | 10-275679 A | 10/1998 |
| JP | 11-111457 A | 4/1999 |
| JP | 11-121165 A | 4/1999 |
| JP | 2000-3782 A | 1/2000 |
| JP | 2000-164350 A | 6/2000 |
| JP | 2000-173766 | 6/2000 |
| JP | 2001-093664 A | 4/2001 |
| JP | 2001-126862 A | 5/2001 |
| JP | 2001-167876 A | 6/2001 |
| JP | 2001-291580 A | 10/2001 |
| JP | 2001-345172 A | 12/2001 |

OTHER PUBLICATIONS

Translation of Notice of Reasons for Rejection issued in corresponding Japanese application JP 2002-206226 dated Mar. 28, 2003.

Partial English translation of the Written Opinion dated May 27, 2003 issued in international application No. PCT/JP03/08844.

C.W. Tang et al.; "Organic electroluminescent diodes"; Appl. Phys. Lett. 51 (12), Sep. 21, 1987; pp. 913-915. 1987 American Institute of Physics.

Kinou Zairyou; "Organic Luminescent Materials and Devices"; Functional Materials vol. 18, No. 2; 1998; pp. 36-50. This document is described in the specification of the present application.

* cited by examiner

Light emitting face

Light emitting face

ORGANIC MULTICOLOR EMISSION AND DISPLAY DEVICE AND METHOD FOR MANUFACTURING SAME

CROSS-REFERENCE TO RELATED APPLICATION

This is a National Phase application of International Application PCT/JP2003/008844 having an international filing date of Jul. 11, 2003, and claims priority to Japanese Application No. JP 2002-206226, filed on Jul. 15, 2002. The disclosure of the PCT and priority applications, in their entirety, including the drawings, claims, and the specification thereof, are incorporated herein by reference.

TECHNICAL FIELD OF THE INVENTION

The present invention relates to an organic multicolor emission and display device that allows high precision multicolor display and is excellent in productivity and resistance to environment. More in detail, the invention relates to an organic multicolor emission and display device suited for use in display in image sensors, personal computers, word processors, TV sets, facsimile machines, audio systems, video recorders, car navigation systems, electronic calculators, telephones, potable terminals, and industrial instruments. The invention relates to an organic multicolor emission and display device employing a color conversion system, in particular. The invention also relates to a method of manufacturing such a device.

BACKGROUND OF THE INVENTION

With diversification of information in recent years, display devices in information field including solid state imaging devices need "beauty, light weight, thinness, and excellence". In addition, active developments are progressing for low power consumption and fast response. Researches and developments in high precision full color display devices, in particular, are being made widely.

As is well known, in the field of organic electroluminescence (hereinafter also called as organic EL), C. W. Tang et al reported (in Appl. Phys. Lett. 51, 913 (1987)) that high luminance of more than 1,000 cd/m$^2$ was obtained at an applied voltage of 10 V in a device having a layered structure of thin films of organic molecules. Since the report, researches have been promoted directing to practical application of organic EL devices. Similar devices using organic polymer materials are being actively developed as well.

Organic EL devices are superior to liquid crystal display devices in dependence on angle of visibility and response speed. Further, high luminance and high emission efficiency can be expected owing to high current density at low voltage in comparison with inorganic EL devices and LEDs.

Distinctive features of a display device of organic EL are: (i) high luminance and high contrast, (ii) low voltage drive and high emission efficiency, (iii) high resolution, (iv) wide angle of visibility, (v) fast response, (vi) possibility of microstructure and color display, and (vii) light weight and thinness. Because of these features, organic EL devices are expected to apply to flat panel display to perform "beauty, light weight, thinness, and excellence".

Pioneer Corporation already commercialized green color monochromatic organic EL display for vehicle mounting in November 1997. To meet diversifying social needs, practical implementation of organic EL multicolor display devices is eagerly expected that exhibit long-term stability, fast response, multicolor display, and capability of high precision full-color display.

Multicolor or full-color display of an organic EL color display device can be performed by a method in which emission elements for three primary colors, red, green, and blue, are separately arranged in a matrix form and each element emits light. (Refer to Japanese Unexamined Patent Application Publication Nos. S57-157487, S58-147989, and H3-214593.) To obtain multicolor by using organic light emitting elements, three types of light emitting materials for R, G, and B must be arranged in a matrix form with high precision. Therefore, the method involves technical difficulty and does not allow production with low cost. Further, difference in lifetimes of three light emission materials reveals a drawback that the chromaticity shifts with time.

Another method is known in which a backlight emitting white light and color filters are used and three primary color light transmits the filters. (Refer to Japanese Unexamined Patent Application Publication Nos. H1-315988, H2-273496, and H3-194895.) However, an organic light emitting element has not been found that emits bright white light required to obtain bright RGB and that exhibits long life.

Still another method is also known in which light from a light emitting element is absorbed in fluorescent elements separately arranged in a plane and each fluorescent element emits fluorescent light in each different color. (Refer to Japanese Unexamined Patent Application Publication No. H3-152897.) The method disclosed in this reference, in which a light emitting element is used to obtain multiple colors through fluorescent elements, is applied to CRT and plasma display.

In recent years, a color conversion system has been disclosed in which filters of fluorescent material are used that absorb light from an organic light emitting element and emit fluorescent light in a visible light range. (Refer to Japanese Unexamined Patent Application Publication Nos. H3-152897 and H5-258860.) The light to be emitted from the organic light emitting element is not limited to white light in this system. Therefore, brighter organic light emitting element can be used for a light source. A color conversion system using an organic light emitting element that emits blue light converts the emitted blue light to green light and red light through fluorescent materials by wave length conversion. (Refer to Japanese Unexamined Patent Application Publication Nos. H3-152897, H8-286033, and H9-208944.) By patterning a fluorescent light conversion film containing fluorescent dyes with high precision, a full-color light emitting type display can be constructed using relatively low energy radiation such as near ultraviolet or visible light from the light emitting element.

Methods for patterning a color conversion filter are disclosed as follows.

(a) As in the case of an inorganic fluorescent element, fluorescent dye is dispersed in liquid of resist (photo-reactive polymer). After forming a film by spin-coating or another method, patterning is conducted by photolithography. (Refer to Japanese Unexamined Patent Application Publication Nos. H5-198921 and H5-258860.)

(b) Fluorescent dye or pigment is dispersed in basic binder. A film of the above material is patterned by etching in an acidic aqueous solution. (Refer to Japanese Unexamined Patent Application Publication No. H9-208944.)

The color conversion system that is regarded promising for obtaining a multicolor display device, however, has a problem that the fluorescent filter for converting to a fluorescent light with the target wavelength is extremely weak against light with a special wavelength, moisture, heat, and organic solvent. These factors readily decompose the material of the fluorescent filter and causes loss of functions of the filter. Consequently, constraints are posed on the manufacturing process of multicolor organic EL devices.

In a conventional process of manufacturing a multicolor organic EL device of the color conversion system, the process (film deposition, photolithography) of forming a transparent ITO electrode, which is an anode of an organic light emitting element, is liable to deteriorate the conversion characteristics (conversion efficiency, color purity) of the color conversion filter by heat generated in the process. Therefore, it is difficult to form an organic light emitting element directly on a protective layer.

To solve this problem, a so-called inversion structure has been proposed. In the structure, first cathode films are deposited on a transparent substrate. Then, an organic layer, anodes, a protective layer, and color conversion filters are sequentially formed. The structure, however, involves a problem that the organic light emitting layer deteriorates in a wet process for forming the color conversion filters. The organic light emitting layer is sensitively affected by the environment, in particular, moisture. Moisture promotes crystallization of the organic layer. Moisture also penetrates between the electrode and the organic light emitting layer and causes cleavage between them, thereby generating dark spots, in which light emission fails on voltage application. In the inversion structure, a cathode is formed on a glass substrate of the device. Since the cathode and the anode must be orthogonal, a process of patterning the cathode (photolithography process) is necessary. Cathode material of a metal or an alloy with low work-function such as Al—Li is oxidized and electron injection performance deteriorates, causing degradation of light emission efficiency of the device.

To solve this problem, a method of manufacturing an organic EL device has been proposed (Japanese Unexamined Patent Application Publication No. 2001-93664). The method comprises a step of forming an organic light emitting element by laminating a cathode, an organic light emitting layer, and a transparent electrode on a first substrate, a step of forming a color conversion filter on a transparent second substrate, the filter receiving electroluminescence from the organic light emitting layer and emitting fluorescent light, and a step of arranging the first and the second substrates opposite to each other in such a way that the organic light emitting element and the color conversion filter are sandwiched by the substrates.

Important performance for practical application to color display is long term stability of light emitting characteristics as well as precise color display performance (Refer to *Kinou Zairyou*: Vol. 18, No. 2, p 36-(published in 1998)). Nevertheless, organic EL devices have a drawback that light emitting performances including current—luminance characteristic significantly degrade after certain period of operation.

Principal cause of the deterioration of light emission performance is growth of dark spots; the dark spot is a defect spot of light emission. The growth of dark spot proceeds along with progress of oxidation in the operating period and the storing period, and the dark spots expand towards whole of the light emission surface.

The dark spot is considered to be originated from oxidation or aggregation of materials of the laminated layers of the light emitting element caused by oxygen or moisture contained in the element. The growth of dark spots proceeds in storage as well as in operation. The growth of dark spots specifically is:

(a) accelerated by oxygen or moisture around the element;
(b) affected by oxygen or moisture adsorbed on the laminated organic films; and
(c) affected by moisture that is adsorbed on the parts for manufacturing the device or moisture that invades in the manufacturing process. To attain the long term stability of light emission performance, the growth of dark spots must be suppressed.

A color conversion filter, which is a mixture of a resin and color conversion dyes contained in the resin as described previously, does not allow drying at a temperature over 200° C. because of thermal stability of the mixed dyes. Consequently, a color conversion filter is apt to be formed in a condition retaining moisture that is contained in the coating liquid or that has invaded in the patterning process. The factor to promote the dark spot growth is the moisture contained in the color conversion filter or the moisture arrived into the sealed off region through a protective layer in the period of storage or operation.

The following describes, referring to a drawing, a principal factor of the dark spot growth that has been found based on the study by the inventors.

FIG. 4 is a sectional view of a conventional organic EL multicolor display device using a color conversion filter. The symbols in FIG. 4 represent;

1: a transparent substrate, 2: a red color conversion filter, 3: a green color conversion filter, 4: a blue color conversion filter, 5: a flattening layer, 6: a protective layer, 7: a transparent lower electrode (anode), 8: a hole injection layer, 9: a hole transport layer, 10: an organic light emitting layer, 11: an electron injection layer, 12: an upper electrode (cathode), 13: a desiccant, and 14: sealing glass.

FIG. 4 shows a four-layer structure of organic thin film layers comprising a hole injection layer 8, a hole transport layer 9, an organic light emitting layer 10, and an electron injection layer 11. Moisture or solvent penetrates into the organic thin film layers sandwiched between the transparent lower electrode 7 and the upper electrode 12. With the diffusion of the moisture or solvent, aggregation or crystallization occurs at the operating temperature in the molecules composing the organic thin film layers. As a result, adhesiveness with the lower electrode or with the upper electrode lowers, or the distance between the lower electrode and the upper electrode increases, which is the reason for the dark spots.

Accordingly, removal of the moisture can be a means to suppress the dark spot growth. Desiccating methods have been proposed including a method that provides a desiccant of phosphorus pentoxide in the internal space of the device and seals off the space (Refer to Japanese Unexamined Patent Application Publication No. H3-261091), and a method that constructs a lamination structure comprising a protective layer and a sealing layer containing phosphorus pentoxide. (Refer to Japanese Unexamined Patent Application Publication No. H7-169567.) In these methods, however, the desiccant of phosphorus pentoxide absorbs the moisture to change into phosphoric acid and adversely affects the organic lamination. Other methods have been further proposed including a method in which the space over the laminate and the space within the sealed container are filled with inactive liquid containing desiccant agent (Refer to Japanese Unexamined Patent Application Publication Nos. H5-41281 and H9-35868), and a method that uses a pressure-sensitive adhesive (Refer to U.S. Pat. No. 5,304,419). But, the methods have not reached a satisfactory solution.

FIG. 4 is, as described above, a schematic sectional view of the whole structure of a conventional organic light emitting device using a color conversion filter. The following describes the structure of FIG. 4 in more detail and clarify the problem to be solved by the present invention.

FIG. 4 shows a part corresponding to one pixel of an organic light emitting apparatus comprising multiple pigments for use in multicolor or full-color display. Color conversion filters 2, 3, and 4 containing red, green and blue dyes or pigments are formed on a transparent substrate 1. Then, a flattening layer 5 and a protective layer 6 are formed. The organic light emitting device further comprises transparent anodes 7 (transparent lower electrodes) of ITO or the like formed on the protective layer 6 by patterning, a hole injection layer 8 covering the anodes 7, a hole transport layer 9 formed on the hole injection layer 8, an organic light emitting layer 10 formed on the hole transport layer 9, an electron injection layer 11 formed on the organic light emitting layer 10, and a cathode 12 (an upper electrode) of a metal or an alloy formed on the electron injection layer 11. Each of the groups of the transparent electrodes 7 and the upper electrodes 12 are formed as a line pattern with a predetermined gap between the lines. The two line patterns are arranged orthogonal with each other. Resulted parts of an organic light emitting device is put into a glove box filled with a dry nitrogen atmosphere (oxygen content and moisture content are below 10 ppm) and are adhered to a sealing glass 14 provided with a desiccant 13 using a UV-curing adhesive.

In a case of a structure of an organic light emitting device that is different from the structure of FIG. 4 and comprises a first substrate having the organic light emitting layer and another substrate having a color conversion filter layer, the two substrates being stuck together, the conventional desiccating member as shown in FIG. 4 cannot be provided because of structural or spatial restriction since the conventional structure needs to occupy certain space for the desiccating member. As a result, such an organic light emitting device lacks long term reliability.

Therefore, a problem to be solved by the invention is a problem involved in the above described "an organic EL light emitting device comprising a first substrate having an organic light emitting layer and another substrate having a color conversion filter layer, the two substrates being stuck together", and an object of the invention is to produce and provide such an organic EL multicolor display device of a color conversion system that maintains stable light emitting performance for a long period and exhibits excellent angle of visibility.

DISCLOSURE OF THE INVENTION

To solve the above problems, an organic multicolor emission and display device according to the present invention comprises: a first substrate; an organic light emitting element including at least a first electrode, an organic light emitting layer, and a transparent second electrode laminated on the first substrate; a transparent second substrate; a color conversion filter layer formed on the transparent second substrate, the color conversion filter layer receiving electroluminescence from the organic light emitting layer and generating colored light; and a gap material that positions the first substrate and the second substrate opposite to each other in such a way that the organic light emitting element is opposite to the color conversion filter layer with a predetermined clearance, and that seals a space between the first substrate and the second substrate; wherein the gap material is placed along an outer peripheral region on an inner surface of the first substrate, the organic light emitting element being provided on the inner surface of the first substrate and the organic light emitting element being absent on the outer peripheral region of the first substrate; and the gap material is placed also along an outer peripheral region on an inner surface of the second substrate, the color conversion filter layer being provided on the inner surface of the second substrate, and the color conversion filter layer being absent on the outer peripheral region of the second substrate; and the gap material performs function to desiccate atmosphere of a sealed space between the first substrate and the second substrate.

Another organic multicolor emission and display device according to the invention comprises: a first substrate; a transparent second substrate; a color conversion filter layer formed on the transparent second substrate; an organic light emitting element including at least a first electrode, an organic light emitting layer, and a transparent second electrode, the light emitting element being formed on the color conversion filter layer with the transparent second electrode facing the color conversion filter layer; a gap material that positions the first substrate and the second substrate opposite to each other in such a way that the organic light emitting element above the second substrate is opposite to the first substrate with a predetermined clearance, and that seals a space between the first substrate and the second substrate; wherein, the gap material is placed along an outer peripheral region on an inner surface of the second substrate, functional layers including the color conversion filter layer and the organic light emitting element being provided on the inner surface of the second substrate and the functional layers being absent on the outer peripheral region of the second substrate; and the gap material is placed also along an peripheral region on an inner surface of the first substrate, the peripheral region of the first substrate being opposite to the peripheral region of the inner surface of the second substrate; and the gap material performs function to desiccate atmosphere of a sealed space between the first substrate and the second substrate.

A method for manufacturing an organic multicolor emission and display device according to the present invention comprises steps of: forming an organic light emitting element by laminating at least a first electrode, an organic light emitting layer, and a second electrode on a first substrate; forming a color conversion filter layer on a transparent second substrate, the color conversion filter layer receiving electroluminescence from the organic light emitting layer and generating colored light; and positioning the first substrate and the second substrate opposite to each other with a gap material, and sealing a space between the first substrate and the second substrate with the gap material; wherein the gap material is placed along an outer peripheral region on an inner surface of the first substrate, the organic light emitting element being provided on the inner surface of the first substrate and the light emitting element being absent on the outer peripheral region of the first substrate; and the gap material is also placed along an outer peripheral region on an inner surface of the second substrate, the color conversion filter layer being provided on the inner surface of the second substrate, and the color conversion filter layer being absent on the outer peripheral region of the second substrate; the gap material performs function to desiccate surrounding atmosphere; and the gap material positions the first and the second substrates in such a way that the organic light emitting element is opposite to the color conversion filter layer with a predetermined clearance.

Another method for manufacturing an organic multicolor emission and display device according to the invention comprises steps of preparing a first substrate and a transparent second substrate; forming a color conversion filter layer on the transparent second substrate; forming a light emitting element comprising at least a first electrode, an organic light emitting layer, and a transparent second electrode on the color conversion filter layer in such a way that the transparent second electrodes facing the color conversion filter layer; positioning the first substrate and the second substrate opposite to each other with a gap material, and sealing a space between the first substrate and the second substrate with the gap material; wherein the gap material is placed along an outer peripheral region on an inner surface of the second substrate, functional layers including the color conversion filter layer and the organic light emitting element being provided on the inner surface of the second substrate and the functional layers being absent on the outer peripheral region of the second substrate; and the gap material is placed also long an peripheral region on an inner surface of the first substrate, the peripheral region of the first substrate being opposite to the peripheral region of the second substrate; the gap material performs function to desiccate surrounding atmosphere; and the gap material positions the first and the second substrates in such a way that the organic light emitting element above the second substrate is opposite to the first substrate with a predetermined clearance.

Figure 1:
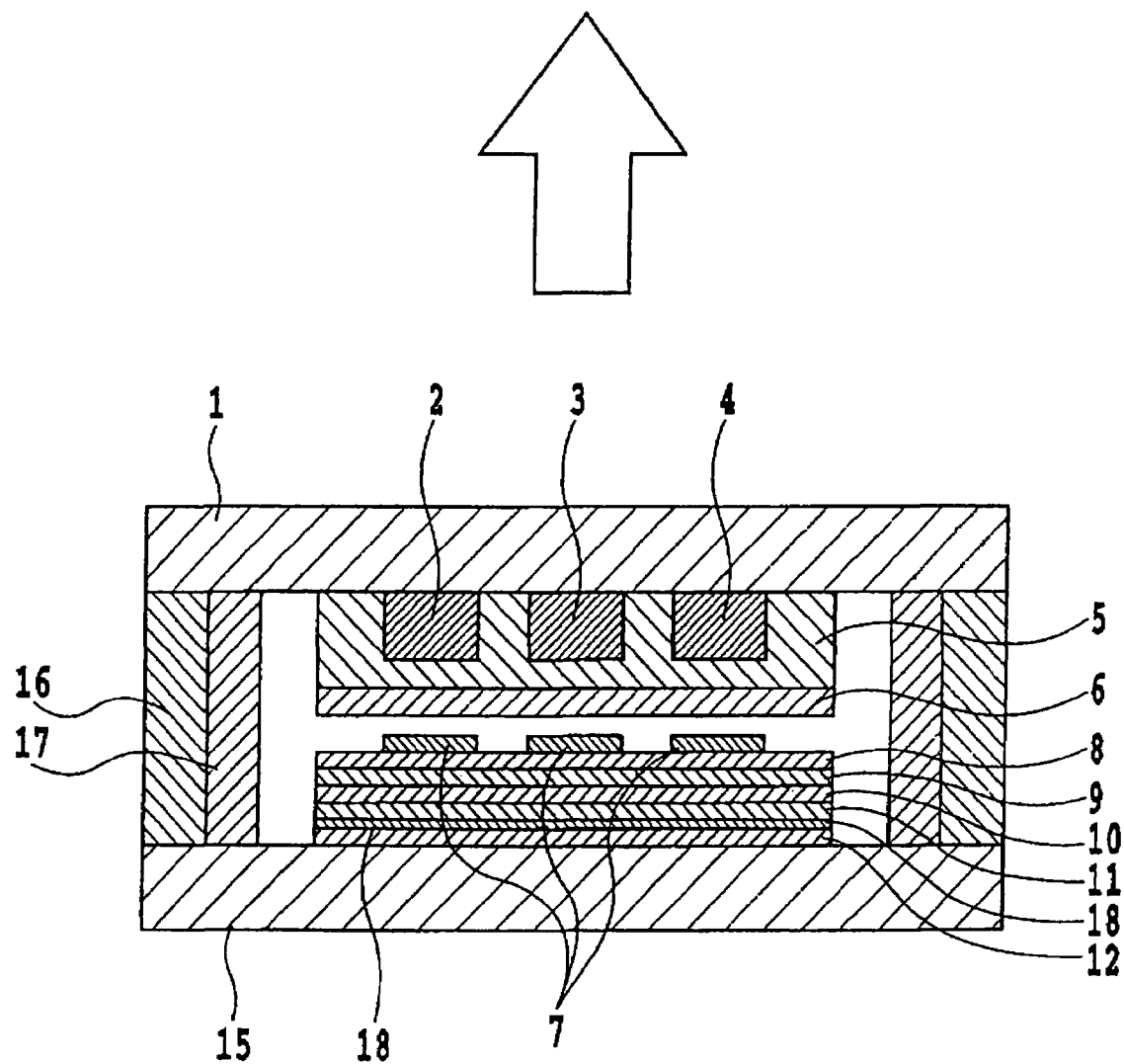
FIG. 1 is a schematic sectional view of an organic multicolor emission and display device of an embodiment according to the present invention.

DESCRIPTION OF SYMBOLS 1, 1b transparent substrate
2, 2b red color conversion filter
3, 3b green color conversion filter
4, 4b blue color conversion filter
5, 5b flattening layer
6, 6b protective layer
7, 7b transparent electrode
8, 8b hole injection layer
9, 9b hole transport layer
10, 10b organic light emitting layer
11, 11b electron injection layer
12, 12b electrode
13b desiccant
15, 15b sealing glass (substrate)
16, 16b outer gap material
17, 17b inner gap material

BEST MODE FOR EMBODIMENT OF THE INVENTION

In the above described structure according to the present invention, advantageously, the gap material placed along the outer peripheral region on the inner surfaces of the first substrate and the second substrate has different void fractions between in an inner portion of the gap material facing the sealed space and in an outer portion of the gap material facing external atmosphere.

Advantageously, the gap material has a void fraction of at most 1% in the outer portion of the gap material and a void fraction of from 50% to 90% in the inner portion of the gap material.

Advantageously, the inner portion of the gap material, in which a void fraction is from 50% to 90%, occupies from 10% to 90% of total width of the gap material extending from innermost end to outermost end of the gap material.

Advantageously, the inner portion of the gap material holds an oxide of an alkali metal or an oxide of an alkaline earth metal in voids within the gap material.

Advantageously, the gap material is composed of an inorganic compound represented by metal oxides such as alumina and zirconia and metal nitrides such as silicon nitride and boron nitride.

Advantageously sealing height dimension between the first substrate and the second substrate of the gap material is in a range of 1 μm to 100 μm.

Because the gap material itself performs desiccating function in the structure according to the invention, desiccation of a sealed space within an organic EL light emitting device can be performed even in "an organic EL light emitting device comprising a first substrate having an organic light emitting layer and another substrate having a color conversion filter layer, the two substrates being stuck together", which poses structural or spatial restriction.

A gap material performing desiccating function in the invention allows having different void fractions between in the inner portion and outer portion of the gap material, thereby exhibiting the following effects. By arranging a low void fraction and high density gap material in the outer portion of the gap material, external moisture is prevented to invade into the device. By arranging a high void fraction gap material and holding desiccant agent in the voids, area of contacting interface between the sealed space and the desiccating agent is increased, to capture moisture remaining in the atmosphere of the sealed space and moisture slightly penetrating from the external environment. Thus, impact of moisture on the device is substantially suppressed. In this structure, the void fraction of the inner gap material is preferably adjusted in the range of 50 to 90% depending on the volume of the sealed space, to accommodate to the sealing length of the periphery of the device and to the volume between the substrates (volume of the sealed space). In a case of large display area, for example, in which the total sealing length is elongated with the gap material and the volume of the sealed space is increased, the void fraction of the inner gap material is made high. In a case of small display area, in which the volume of the sealed space is small, the void fraction of the inner gap material is made low. In this way, a capture rate of moisture is held constant and various structure and size of an organic EL device can be accommodated.

The desiccant agent held in the voids of the gap material can be selected from known materials of oxides of an alkali metal or oxides of an alkaline earth metal. A homogeneously dispersed desiccant material can be provided by making the desiccant agent into a solution by means of a sol-gel method or a hydrothermal method.

The gap material is possible to exhibit any void fraction. The gap material can be composed of a material with high mechanical strength for example, an inorganic compound including oxides of a metal, e.g., alumina and zirconia, and nitrides of a metal, e.g., aluminum nitride and silicon nitride. These materials can be formed into a thin film by means of a sheet-forming method (doctor blade, extrusion, injection molding, and others), and can be applied to a gap material in the invention.

By adjusting a thickness of the gap material (a distance between the first substrate and the second substrate) in the range of 1 µm to 100 µm, an organic EL device performing favorable angle of visibility can be obtained.

When a light emission structure is a top emission structure in the present invention, a substrate for laminating color filter layers corresponding to three primary colors must be transparent in the visible light range. A substrate in this case can be composed of glass or a polymer for example, polyester.

A color conversion filter layer for red or green color is generally a laminate of a respective color filter layer and a color conversion layer, while for blue color, the color conversion filter layer is composed of only a color filter layer.

A transparent lower electrode is generally composed of IZO or ITO. The IZO and ITO used for a transparent lower electrode, exhibiting high work function, is suited for use in an anode, though occasionally used in a cathode. When a transparent lower electrode is used for a cathode, a layer of low work function material can be provided between the transparent lower electrode and an organic EL emission layer, to improve electron injection efficiency. The low work function material can be selected from metals with electron injection property, alloys with other metals, and compounds of the metals, including alkali metals such as potassium, lithium and sodium, alkaline earth metals such as calcium, magnesium, and strontium, and fluorides of these metals. A layer of the low work function material having a thickness of not larger than 10 nm is sufficient for improving electron injection efficiency, and also favorable from the view point of securing transparency.

An organic EL emission layer of an organic multicolor emission and display device in the present invention comprises at least an organic light emitting layer, and as required, has a structure intervening a hole injection layer, a hole transport layer, an electron transport layer, and/or electron injection layer. Specifically, one of the following layer structures is selected (wherein an anode connects to an organic light emitting layer or a hole injection layer, and a cathode connects to an organic light emitting layer or an electron injection layer).

(1) an organic light emitting layer,
(2) An hole injection layer/an organic light emitting layer,
(3) an organic light emitting layer/an electron injection layer,
(4) a hole injection layer/and organic light emitting layer/an electron injection layer,
(5) a hole injection layer/a hole transport layer/an organic light emitting layer/an electron injection layer,
(6) a hole injection layer/a hole transport layer/an organic light emitting layer/an electron transport layer/an electron injection layer.

A material for each of the above layers can be selected from known materials. To obtain light emission in blue to blue-green color, the organic light emitting layer preferably contains a fluorescent whitening agent such as benzothiazole, benzoimidazole, or benzoxiazole, or a metal-chelate oxonium compound, a styrylbenzene compound, or an aromatic dimethylidine compound. Material for the electron injection layer can be selected from quinoline derivative (such as an organic metal complex having a ligand of 8-quinolinole), an oxadiazole derivative, a perylene derivative, a pyridine derivative, a pyrimidine derivative, a quinoxaline derivative, a diphenylquinone derivative, and a nitro-substituted fluorene derivative.

An upper electrode formed on the organic EL emission layer is formed as a line pattern having predetermined gaps between the lines for passive matrix driving. The line pattern extends orthogonal to the line pattern of the transparent lower electrodes. On application of the voltages on a line of the line pattern of the transparent lower electrode and on a line of the line pattern of the upper electrode in this structure of the electrodes, the organic EL emission layer emits light at the cross point of the two lines.

The upper electrode is required to exhibit high carrier injection ability into the organic EL emission layer and to reflect the emitted light from the organic EL emission layer back to the substrate direction. An upper electrode working as an anode is formed of a material exhibiting high work function to improve hole injection ability. Preferable materials include transparent conductive oxides such as ITO and IZO. In this structure, a reflective metal layer (for example, aluminum) is preferably provided on the upper electrode to reflect emitted light from the organic EL emission layer towards the substrate. In the case the upper layer works as a cathode, the upper electrode is formed of a material exhibiting low work function to give electron injection ability to the electrode. Favorable materials include metals exhibiting electron injection ability, compounds of these metals, and alloys of the metal with other metals. More specifically, the favorable materials include alkali metals such as potassium, lithium and sodium, alkaline earth metals such as calcium, magnesium, and strontium, and fluorides of these metals. In this case too, it is favorable, though not essential, to provide a reflective metal layer (for example, aluminum) on the upper electrode for increasing reflection.

In the present invention, a desiccating material can be provided, as described previously, in a sticking place between a substrate mounting a color filter and a color conversion filter and a substrate mounting an organic light emitting element. However, the invention can clearly be applied to a conventional structure in which one of the two substrates mounts all of a color conversion filter, a color filter, and an organic light emitting element.

EXAMPLES

Some examples of embodiment according to the present invention will be described below with reference to accompanying drawings.

FIG. 1 shows an example of embodiment of the invention.

Embodiment Example 1

[Manufacture of Color Conversion Filter Substrate]

[Fabrication of a Blue Filter]

A transparent substrate 1 of Corning glass (50×50×0.7 mm) was coated with blue filter material (Color Mosaic (CB-7001) manufactured by Fuji-Hunt Electronics Technology Co., Ltd.) by a spin-coating method. Then, patterning was conducted by a photolithography method to obtain a line pattern of a blue filter 4 with a line width of 0.1 mm, a pitch of 0.33 mm, and a film thickness of 6 µm.

[Fabrication of a Green Color Conversion Filter]

A fluorescent dye of Coumarin 6 (0.7 parts by weight) was dissolved in 120 parts by weight of a solvent of propylene glycol monoethyl acetate (PGMEA). One hundred parts by weight of a photopolymerizing resin "V259 PA/P5" (a trade name of a product of Nippon Steel Chemical Co., Ltd.) is added and dissolved to obtain a coating liquid. This coating liquid was applied by a spin-coating method on a transparent substrate 1 of Corning glass (50×50×0.7 mm) followed by patterning by a photolithography method to obtain a line pattern of a green color conversion filter 3 with a line width of 0.1 mm, a pitch of 0.33 mm, and a film thickness of 10 μm.

[Fabrication of Red Color Conversion Filter Layer]

Fluorescent dyes of Coumarin 6 (0.6 parts by weight), Rhodamine 6G (0.3 parts by weight), and Basic Violet 11 (0.3 parts by weight) are dissolved in 120 parts by weight of a solvent of propyleneglycol monoethyl acetate (PGMEA). One hundred parts by weight of a photopolymerizing resin "V 259PA/P5" (a trade name of a product of Nippon Steel Chemical Industries Co., Ltd.) was added and dissolved to obtain a coating liquid. This coating liquid was applied by a spin-coating method onto a transparent substrate 1 of Corning glass (50×50×1.1 mm) followed by patterning by a photolithography method to obtain a line pattern of a red color conversion filter 2 with a line width of 0.1 mm, a pitch of 0.33 mm, and a film thickness of 10 μm.

[Fabrication of a Flattening Layer and a Protective Layer]

Over those fluorescent light conversion filters, a UV-curing resin (epoxy-modified acrylate) for a flattening layer 5 was applied by a spin-coating method followed by irradiation using a high pressure mercury lamp to form a flattening layer 5 having thickness of 5 μm. On this flattening layer 5, a protective layer 6 of SiOx film 300 nm thick was deposited by a sputtering method.

[Manufacture of an Organic EL Element Substrate]

A glass transparent substrate 15 was put into a resistance heating evaporation apparatus. An upper electrode (a cathode) 12 of an aluminum layer 12 having thickness of about 100 nm was deposited under a low pressure of $1\times10^{-4}$ Pa. Patterning was conducted on the upper electrode 12 with a 2 mm line, and a 0.5 mm pitch by a lithography method. The resulted substrate was then placed again in the resistive heating evaporation apparatus and a buffer layer 18 of LiF 10 nm thick was formed. Subsequently, a four layer structure of organic layers was formed depositing electron injection layer 11, light emitting layer 10, a hole transport layer 9, and a hole injection layer 8 in this sequence. The hole injection layer 8 with a thickness of 100 nm was formed of copper phthalocyanine (CuPc). The hole transport layer 9 with a thickness of 20 nm was formed of 4,4"-bis[N-(1-naphtyl)-N-phenylamino] biphenyl (α-NPD). The light emitting layer 10 with a thickness of 30 nm was formed of 4,4"-bis(2,2 diphenylbinyl) biphenyl (DPVBi). The electron injection layer 11 with a thickness of 20 nm was formed of aluminum chelate (Alq). After completion of deposition of these layers, a transparent lower electrode (anode) 7 was deposited by means of an electron beam evaporation method using a mask to produce a stripe pattern of 2 mm line and 0.5 mm pitch, orthogonal to the aluminum lines (cathode) 12.

[Formation of Gap Material]

Materials for an outer gap material 16 and an inner gap material 17 used in this example of embodiment were alumina plate having a void fraction of at most 1% and alumina plate having a void fraction of 90%, respectively. Dimensions of the outer gap material of alumina plate 16 are outer circumference of 50 mm square and a width of 2 mm, which means inner circumference of 46 mm square. Sealing height dimension of the gap material was 10 μm. The alumina plate 16 was prepared as follows.

Alumina powder (<5 μm) was milled to reduce the particle size below 1 μm using alumina balls and water in an alumina ball mill to prepare for sintering. MgO, SiO2 or other auxiliary was added to promote sintering, to remove voids, and to avoid discontinuous crystal growth.

Quantity of the additive auxiliaries is from 3 to 10 wt %. The powder of raw material 100 was mixed with binder (poly(vinyl alcohol), poly(vinyl butyral) 6-10%), plasticizer (phthalic acid ester, butylphlotayl, butyl glycol or the like) 3-5%, and a solvent (methyl ethyl ketone, acetone, butyl alcohol, or the like) 40-50% and kneaded well. The mixture was supplied to a doctor blade device, put on a film and was drawn from a gap of 1 mm between the doctor blade and the moving film. The plate was put into a drying chamber to remove solvent, to obtain a flexible thin plate about 0.5 mm thick. The formed plate, being flexible, can be punched to various forms to change the form thereof.

The alumina mold plate was sintered at 1,600° C. for 2 hr in an atmospheric environment to obtain an alumina plate for a gap material having a void fraction of at most 1%. This alumina plate was formed to have outer circumferential dimension of 50 mm square and inner circumferential dimension of 46 mm square. Thickness dimension of the alumina plate was 10 μm. Thus, an outer gap material 16 was fabricated.

Inner side alumina plate 17 had an outer circumference of 46 mm square and width of 2 mm, which means inner circumference of 42 mm square. This alumina plate 17 was also fabricated by a doctor blade method like the above-described alumina plate 16. Pore forming material of polyurethane beads with particle diameter of 1-5 μm was used for increasing void fraction. Quantity of the additive material varies with the target void fraction. The additive material of 50 vol % was included to attain 90% of void fraction in this example of embodiment. The pore forming material is dispersed in the mold plate and is oxidized during the step of sintering in the atmospheric environment, to generate voids. In the thus fabricated inner gap material (alumina plate) 17, CaO was impregnated in vacuum by a sol-gel process. To hold the CaO as a desiccant in the alumina, the alumina plate was sintered in the air at 1,000° C. for 2 hr.

The thus fabricated inner gap material 16 and the outer gap material 17 were joined and inserted between the substrates 1 and 15. The two substrates were then stuck together. Spacer material (not shown in the figure) was used for adjusting the gap of sealed space in the sticking step.

[Sticking the Substrates Together]

The substrates 1 and 15 fabricated as described above were adhered together using a UV-curing adhesive, sandwiching the gap materials 16 and 17 in a dry nitrogen atmosphere (oxygen content and moisture content at most 10 ppm) in a glove box. Positioning in the sticking process was conducted using a CCD camera.

Thus manufactured organic EL device of the invention was evaluated. Excellent performances have been confirmed in conversion efficiency of the color conversion filter, electroluminescence of the organic light emitting layer, and long term stability.

Figure 3:
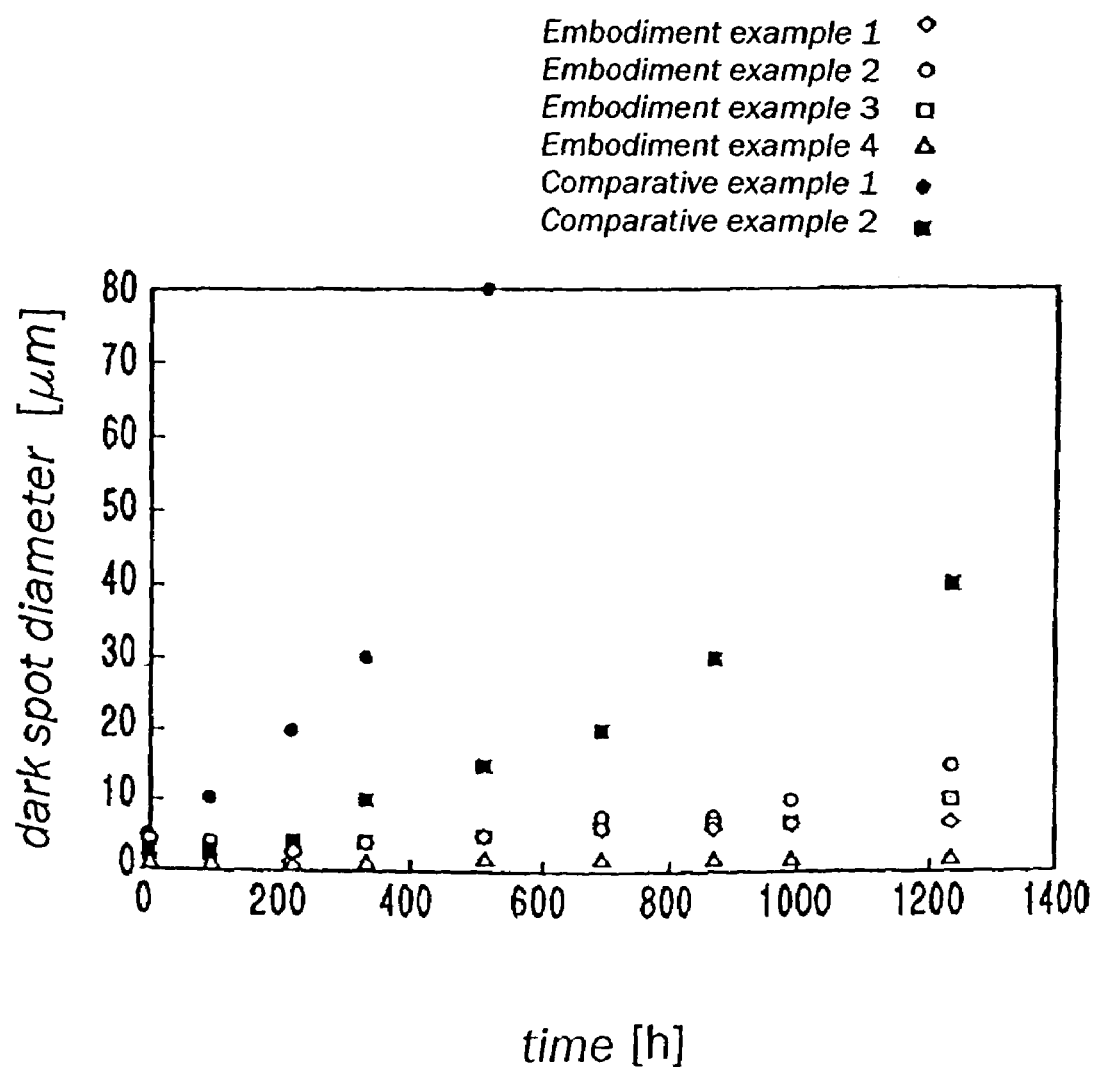
FIG. 3 is a graph showing relationship between time and dark spot diameter in embodiment examples and comparative examples.
Figure 4:
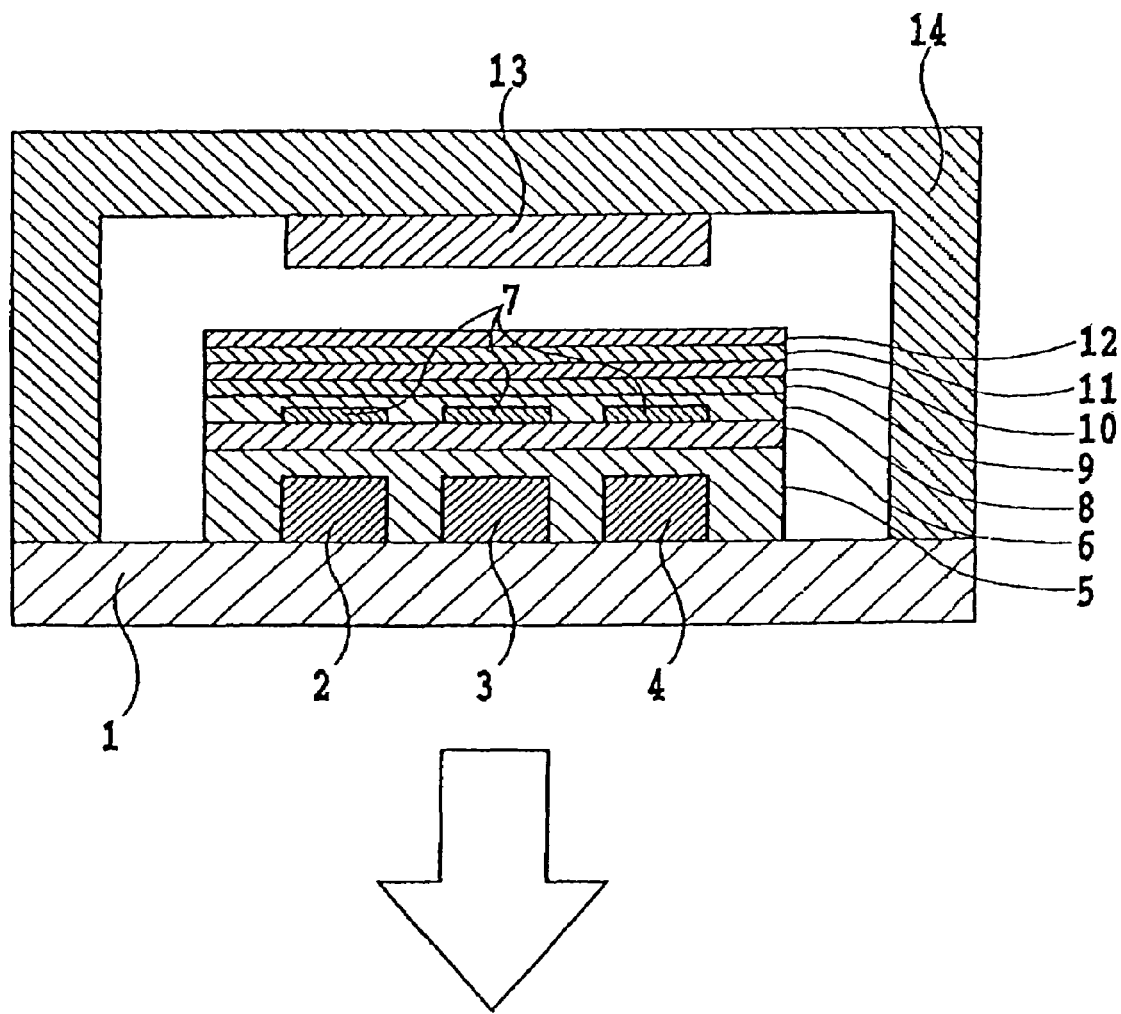
FIG. 4 is a schematic sectional view of a conventional organic multicolor emission and display device using a color conversion filter.

Generation and growth of dark spots were observed as an evaluation of the manufactured organic EL device. Enlarged photograph was initially taken in a light emitting state of the device. The device was subjected to acceleration test of the dark spots in an environment of 60° C. and 90% RH, and observation was made for generation and growth of the dark spots. The observation resulted in very scarce generation and growth of the dark spots. FIG. 3 shows the result. FIG. 3 also gives the results for Embodiment Examples 2 through 4 and Comparative Examples 1 and 2, which will be described later.

Embodiment Example 2

A gap material having a void fraction reduced to 50% was fabricated for an inner side alumina plate 17 (outer circumference of 46 mm square, width 2 mm: inner circumference of 42 mm square).

Thus fabricated inner gap material 17 and the outer gap material 16 that is the same as in Embodiment Example 1 were joined and inserted between the substrates 1 and 15. Sticking the substrates as in Embodiment Example 1, an organic EL light emitting device was manufactured.

Embodiment Example 3

Dimensions of the inner side alumina plate 17 with the void fraction of 90% were outer circumference of 46 mm square, which was unchanged, and a width of 1 mm, which was reduced and corresponded to inner circumference of 44 mm square. By changing the width of the inner gap material 17, the quantity of desiccant (CaO) exposed to sealed atmosphere decreases.

Thus fabricated inner gap material 17 and the outer gap material 16 that is the same as in Embodiment Example 1 were joined and inserted between the substrates 1 and 15. Sticking the substrates as in Embodiment Example 1, an organic EL light emitting device was manufactured.

Comparative Example 1

An inner gap material was fabricated in the same manner as in Embodiment Example 1 except that the desiccant (CaO) was not provided. This inner gap material and the outer gap material were joined and inserted between the two substrates. Sticking the substrates, an organic EL light emitting device was manufactured.

Comparative Example 2

In the structure of Embodiment Example 1, void fraction of the inner alumina plate was reduced to 50% and at the same time, the width was reduced to 1 mm.

Thus fabricated inner gap material and the outer gap material that is the same as in Embodiment Example 1 were joined and inserted between the two substrates. Sticking the substrates as in Embodiment Example 1, an organic EL light emitting device was manufactured.

Embodiment Example 4

Figure 2:
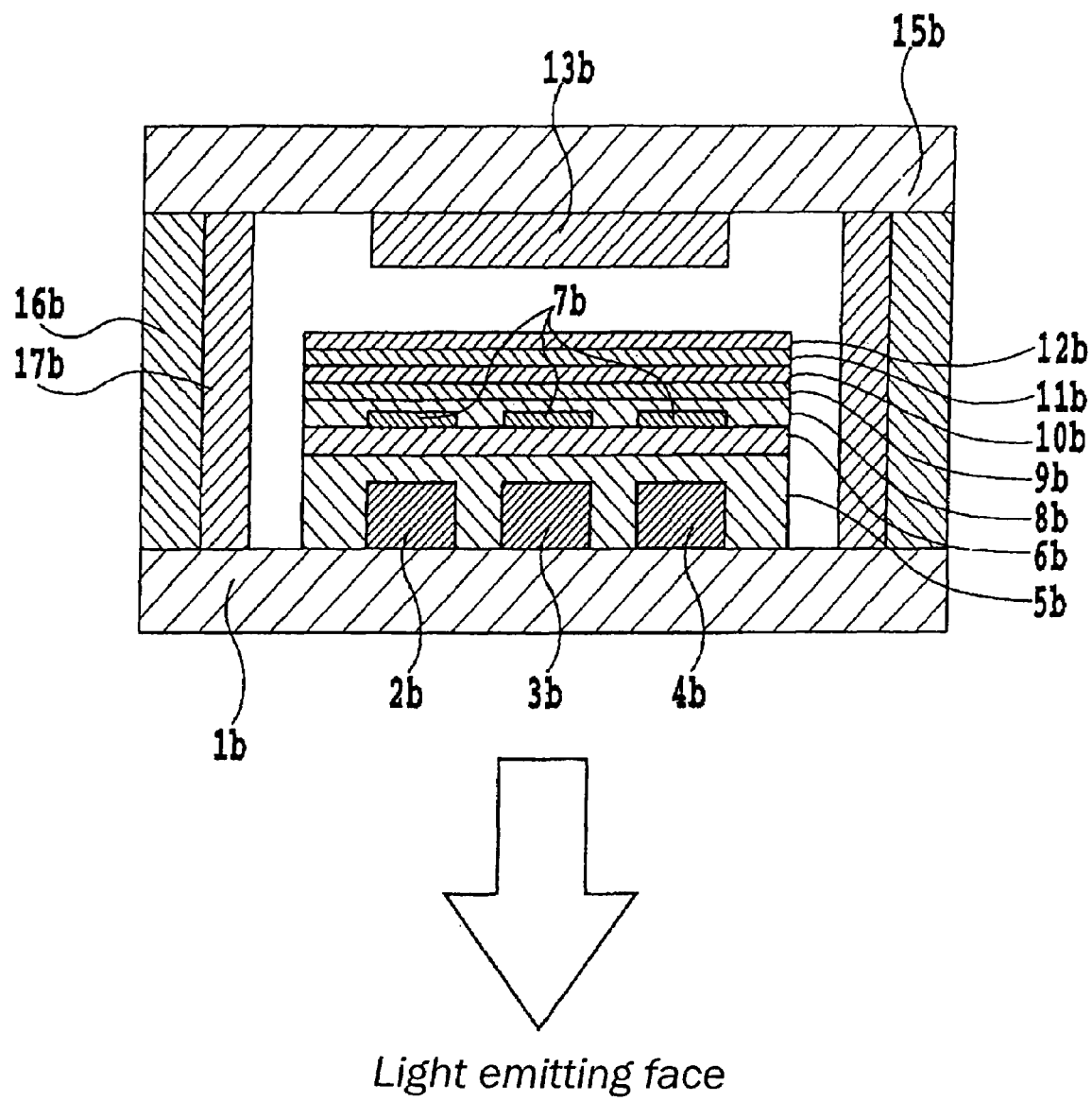
FIG. 2 is a schematic sectional view of an organic multicolor emission and display device of another embodiment according to the present invention.

The features of the present invention can be applied not only to the top emission structure as the embodiment examples (FIG. 1) described above, but also to a bottom emission structure. FIG. 2 shows an example of this application. Each component in FIG. 2 corresponding to like component in FIG. 1 is given the same numeral and added the character "b" indicating a component of a bottom emission structure.

Color conversion filters 2b, 3b, and 4b comprising red, green, and blue dyes or pigments were formed on a transparent substrate 1b. Then, a flattening layer 5b and a protective layer 6b were formed. Further, transparent lower electrodes 7b of ITO or the like were formed on the protective layer 6b by patterning; a hole injection layer 8b was laminated covering the transparent lower electrodes 7b; a hole transport layer 9b was formed on the hole injection layer 8b; and organic light emitting layer 10b was formed on the hole transport layer 9b; an electron injection layer 11b was formed on the organic light emitting layer 10b; and an upper electrode 12b was formed of an metallic electrode on the electron injection layer 11b.

A bottom emission structure is a structure in which light is taken out from the side of the glass substrate 1b that comprises, as described above, the glass substrate mounting color conversion layers or color filters 2b, 3b, and 4b, and further, transparent electrodes 7b/organic layers (8b, 9b, 10b, and 11b)/a metallic electrode 12b. A sealing glass 15b provided with a desiccant 13b of CaO, for example, is arranged opposite to this substrate 1b. An inner gap material 17b of alumina plate with a void fraction of 90% performing desiccating function and an outer gap material 16b of alumina plate with a void fraction of at most 1% are arranged at inner and outer side respectively of the peripheral region between the sealing glass 15b and the glass substrate 1b mounting the organic EL element. The two substrates 1b and 15b are stuck together. Because the light emitted from the organic EL layer 10b transmits through the glass substrate 1b mounting the organic EL element in this structure, the desiccant 13b provided on the sealing glass 15b does not intercept the light.

The Embodiment Examples 2 through 4 and Comparative Examples 1 and 2 were subjected to dark spot acceleration tests and evaluated as in Embodiment Example 1. The results shown in FIG. 3 indicated that dark spot growth was scarcely observed in the Embodiment Examples 1 through 4 according to the invention as compared with Comparative Examples 1 and 2. Embodiment Example 4, in particular, having desiccants at two places, exhibited remarkable effect to suppress dark spot growth in comparison with Embodiment Examples 1 through 3.

While the peripheral dimension of the gap material was identical to the peripheral dimension of the substrate, the two peripheral dimensions need not be identical. Although it is preferable to make the two peripheral dimensions equal and to obtain a single smooth peripheral side face, manufacture of the device is enough possible without the same peripheral dimensions. Provided the gap material and the substrate overlap sufficiently, no problem arises in manufacturing process nor manufactured product.

POSSIBILITY OF INDUSTRIAL APPLICATION

As described so far, an organic multicolor emission and display device according to the present invention comprises: a first substrate; an organic light emitting element including at least a first electrode, an organic light emitting layer, and a transparent second electrode laminated on the first substrate; a transparent second substrate; a color conversion filter layer formed on the transparent second substrate, the color conversion filter layer receiving electroluminescence from the organic light emitting layer and generating colored light; and a gap material that positions the first substrate and the second substrate opposite to each other in such a way that the organic light emitting element is opposite to the color conversion filter layer with a predetermined clearance, and that seals a space between the first substrate and the second substrate; wherein the gap material is placed along an outer peripheral region on an inner surface of the first substrate, the organic light emitting element being provided on the inner surface of the first substrate and the organic light emitting element being absent on the outer peripheral region of the first substrate; and the gap material is placed also along an outer peripheral region on an inner surface of the second substrate, the color conversion filter layer being provided on the inner surface of the second substrate, and the color conversion filter layer being absent on the outer peripheral region of the second substrate; and the gap material performs function to desiccate atmosphere of a sealed space between the first substrate and the second substrate.

Another organic multicolor emission and display device according to the invention comprises: a first substrate; a transparent second substrate; a color conversion filter layer formed on the transparent second substrate; an organic light emitting element including at least a first electrode, an organic light emitting layer, and a transparent second electrode, the light emitting element being formed on the color conversion filter layer with the transparent second electrode facing the color conversion filter layer; a gap material that positions the first substrate and the second substrate opposite to each other in such a way that the organic light emitting element above the second substrate is opposite to the first substrate with a predetermined clearance, and that seals a space between the first substrate and the second substrate; wherein, the gap material is placed along an outer peripheral region on an inner surface of the second substrate, functional layers including the color conversion filter layer and the organic light emitting element being provided on the inner surface of the second substrate and the functional layers being absent on the outer peripheral region of the second substrate; and the gap material is placed also along an peripheral region on an inner surface of the first substrate, the peripheral region of the first substrate being opposite to the peripheral region of the inner surface of the second substrate; and the gap material performs function to desiccate atmosphere of a sealed space between the first substrate and the second substrate.

A method for manufacturing an organic multicolor emission and display device according to the present invention comprises steps of forming an organic light emitting element by laminating at least a first electrode, an organic light emitting layer, and a second electrode on a first substrate; forming a color conversion filter layer on a transparent second substrate, the color conversion filter layer receiving electroluminescence from the organic light emitting layer and generating colored light; and positioning the first substrate and the second substrate opposite to each other with a gap material, and sealing a space between the first substrate and the second substrate with the gap material; wherein the gap material is placed along an outer peripheral region on an inner surface of the first substrate, the organic light emitting element being provided on the inner surface of the first substrate and the light emitting element being absent on the outer peripheral region of the first substrate; and the gap material is also placed along an outer peripheral region on an inner surface of the second substrate, the color conversion filter layer being provided on the inner surface of the second substrate, and the color conversion filter layer being absent on the outer peripheral region of the second substrate; the gap material performs function to desiccate surrounding atmosphere; and the gap material positions the first and the second substrates in such a way that the organic light emitting element is opposite to the color conversion filter layer with a predetermined clearance.

Another method for manufacturing an organic multicolor emission and display device according to the invention comprises steps of: preparing a first substrate and a transparent second substrate; forming a color conversion filter layer on the transparent second substrate; forming a light emitting element comprising at least a first electrode, an organic light emitting layer, and a transparent second electrode on the color conversion filter layer in such a way that the transparent second electrodes facing the color conversion filter layer; positioning the first substrate and the second substrate opposite to each other with a gap material, and sealing a space between the first substrate and the second substrate with the gap material; wherein the gap material is placed along an outer peripheral region on an inner surface of the second substrate, functional layers including the color conversion filter layer and the organic light emitting element being provided on the inner surface of the second substrate and the functional layers being absent on the outer peripheral region of the second substrate; and the gap material is placed also long an peripheral region on an inner surface of the first substrate, the peripheral region of the first substrate being opposite to the peripheral region of the second substrate; the gap material performs function to desiccate surrounding atmosphere; and the gap material positions the first and the second substrates in such a way that the organic light emitting element above the second substrate is opposite to the first substrate with a predetermined clearance.

Because the gap material itself performs desiccating function in the structure according to the invention, desiccation of a sealed space within an organic EL light emitting device can be performed even in "an organic EL light emitting device comprising a first substrate having an organic light emitting layer and another substrate having a color conversion filter layer, the two substrates being stuck together", which poses structural or spatial restriction.

A gap material performing desiccating function in the invention allows having different void fractions between in the inner portion and outer portion of the gap material, thereby exhibiting the following effects. By arranging a low void fraction and high density gap material in the outer portion of the gap material, external moisture is prevented to invade into the device. By arranging a high void fraction gap material and holding desiccant agent in the voids, area of contacting interface between the sealed space and the desiccating agent is increased, to capture moisture remaining in the atmosphere of the sealed space and moisture slightly penetrating from the external environment. Thus, impact of moisture on the device is substantially suppressed. In this structure, the void fraction of the inner gap material is preferably adjusted in the range of 50 to 90% depending on the volume of the sealed space, to accommodate to the sealing length of the periphery of the device and to the volume between the substrates (volume of the sealed space). In a case of large display area, for example, in which the total sealing length is elongated with the gap material and the volume of the sealed space is increased, the void fraction of the inner gap material is made high. In a case of small display area, in which the volume of the sealed space is small, the void fraction of the inner gap material is made low. In this way, a capture rate of moisture is held constant and various structure and size of an organic EL device can be accommodated.

The invention claimed is:

1. An organic multicolor emission and display device comprising:
    a first substrate;
    an organic light emitting element including at least a first electrode, an organic light emitting layer, and a transparent second electrode laminated on the first substrate;
    a transparent second substrate;
    a color conversion filter layer formed on the transparent second substrate, the color conversion filter layer receiving electroluminescence from the organic light emitting layer and generating colored light; and
    a gap material that positions the first substrate and the transparent second substrate opposite to each other in such a way that the organic light emitting element is opposite to the color conversion filter layer with a predetermined clearance, and that seals a space between the first substrate and the transparent second substrate;

wherein the gap material is placed along an outer peripheral region on an inner surface of the first substrate, the organic light emitting element being provided on the inner surface of the first substrate and the organic light emitting element being absent on the outer peripheral region of the first substrate; and the gap material is placed also along an outer peripheral region on an inner surface of the transparent second substrate, the color conversion filter layer being provided on the inner surface of the transparent second substrate, and the color conversion filter layer being absent on the outer peripheral region of the transparent second substrate; and the gap material performs function to desiccate atmosphere of a sealed space between the first substrate and the transparent second substrate, and wherein the gap material placed along the outer peripheral region on the inner surfaces of the first substrate and the transparent second substrate have different porosities between an inner portion of the gap material facing the sealed space and an outer portion of the gap material facing external atmosphere.

2. The organic multicolor emission and display device according to claim 1, wherein the gap material has a porosity of at most 1% in the outer portion of the gap material and a porosity of from 50% to 90% in the inner portion of the gap material.

3. The organic multicolor emission and display device according to claim 2, wherein the inner portion of the gap material, in which a porosity is from 50% to 90%, occupies from 10% to 90% of total width of the gap material extending from innermost end to outermost end of the gap material.

4. The organic multicolor emission and display device according to claim 1, wherein the inner portion of the gap material holds an oxide of an alkali metal or an oxide of an alkaline earth metal in voids within the gap material.

5. The organic multicolor emission and display device according to claim 1, wherein the gap material is composed of an inorganic compound represented by metal oxides and metal nitrides.

6. The organic multicolor emission and display device according to claim 1, wherein a thickness dimension between the first substrate and the transparent second substrate of the gap material is in a range of 1 μm to 100 μm.

7. The organic multicolor emission and display device according to claim 5, wherein the inorganic compound is one of alumina, zirconia, silicon nitride and boron nitride.

8. An organic multicolor emission and display device comprising:
a first substrate;
a transparent second substrate;
a color conversion filter layer formed on the transparent second substrate;
an organic light emitting element including at least a first electrode, an organic light emitting layer, and a transparent second electrode, the light emitting element being formed on the color conversion filter layer with the transparent second electrode facing the color conversion filter layer;
a gap material that positions the first substrate and the transparent second substrate opposite to each other in such a way that the organic light emitting element above the transparent second substrate is opposite to the first substrate with a predetermined clearance, and that seals a space between the first substrate and the transparent second substrate;
wherein the gap material is placed along an outer peripheral region on an inner surface of the transparent second substrate, functional layers including the color conversion filter layer and the organic light emitting element being provided on the inner surface of the transparent second substrate and the functional layers being absent on the outer peripheral region of the transparent second substrate; and the gap material is placed also along a peripheral region on an inner surface of the first substrate, the peripheral region of the first substrate being opposite to the peripheral region of the inner surface of the transparent second substrate; and the gap material performs function to desiccate atmosphere of a sealed space between the first substrate and the transparent second substrate, and wherein the gap material placed along the outer peripheral region on the inner surfaces of the first substrate and the transparent second substrate have different porosities between an inner portion of the gap material facing the sealed space and an outer portion of the gap material facing external atmosphere.

9. The organic multicolor emission and display device according to claim 8, wherein the gap material has a porosity of not greater than 1% in the outer portion of the gap material and a porosity from 50% to 90% in the inner portion of the gap material.

10. The organic multicolor emission and display device according to claim 9, wherein the inner portion of the gap material, in which a porosity is from 50% to 90%, occupies from 10% to 90% of total width of the gap material extending from innermost end to outermost end of the gap material.

11. The organic multicolor emission and display device according to claim 8, wherein the inner portion of the gap material holds an oxide of an alkali metal or an oxide of an alkaline earth metal in voids within the gap material.

12. The organic multicolor emission and display device according to claim 8, wherein the gap material is composed of an inorganic compound represented by metal oxides and metal nitrides.

13. The organic multicolor emission and display device according to claim 8, wherein sealing height dimension between the first substrate and the transparent second substrate of the gap material is in a range of 1 μm to 100 μm.

14. The organic multicolor emission and display device according to claim 8 further comprising a desiccant attached on the inner surface of the first substrate.

15. The organic multicolor emission and display device according to claim 8 further comprising a desiccant attached on the inner surface of the first substrate.

16. The organic multicolor emission and display device according to claim 9 further comprising a desiccant attached on the inner surface of the first substrate.

17. The organic multicolor emission and display device according to claim 10 further comprising a desiccant attached on the inner surface of the first substrate.

18. The organic multicolor emission and display device according to claim 11 further comprising a desiccant attached on the inner surface of the first substrate.

19. The organic multicolor emission and display device according to claim 12 further comprising a desiccant attached on the inner surface of the first substrate.

20. The organic multicolor emission and display device according to claim 13 further comprising a desiccant attached on the inner surface of the first substrate.

21. The organic multicolor emission and display device according to claim 12, wherein the inorganic compound is one of alumina, zirconia, silicon nitride and boron nitride.

* * * * *